United States Patent [19]
Nakamura

[11] Patent Number: 5,631,649
[45] Date of Patent: May 20, 1997

[54] DIGITAL-TO-ANALOG CONVERTER TEST METHOD AND APPARATUS

[75] Inventor: Yasuyuki Nakamura, Tokyo, Japan

[73] Assignee: Mitsubishi Denki Kabushiki Kaisha, Tokyo, Japan

[21] Appl. No.: 660,873

[22] Filed: Jun. 10, 1996

[30] Foreign Application Priority Data

Dec. 22, 1996 [JP] Japan ................. 8-008035

[51] Int. Cl.$^6$ .................................................. H03M 1/10
[52] U.S. Cl. .................................. 341/144; 341/120
[58] Field of Search .................... 341/144, 120, 341/121, 145, 143, 153

[56] References Cited

U.S. PATENT DOCUMENTS

| | | | |
|---|---|---|---|
| 4,137,525 | 1/1979 | Tyrrel | 341/108 |
| 4,335,373 | 7/1982 | Sloanne | 341/120 |

OTHER PUBLICATIONS

"Measuring Methods of Linear Analog–To–Digital Converters and Digital–To–Analog Converters", EIAJ, Technical Committee on Integrated Circuits, Dec., 1994 ED–5104 (pp. 20–26).

*Primary Examiner*—Brian K. Young
*Attorney, Agent, or Firm*—Leydig, Voit & Mayer

[57] ABSTRACT

A method and apparatus for testing the linearity of a digital-to-analog converter that uses equally-weighted signal sources to convert high-order bits of digital input, and unequally-weighted signal sources to convert low-order bits. Minimum and maximum digital inputs are supplied, and a linear input-output characteristic is calculated from the two resulting analog output values. The nonlinearity error is calculated by finding the deviations from this linear input-output characteristic of two sets of analog output values: one set obtained by varying the high-order bits while holding the low-order bits constant; the other set obtained by varying the low-order bits while holding the high-order bits constant.

13 Claims, 11 Drawing Sheets

DIGITAL-TO-ANALOG CONVERTER TEST METHOD AND APPARATUS

BACKGROUND OF THE INVENTION

The present invention relates to a method and apparatus for testing the linearity of a digital-to-analog converter.

Digital-to-analog converters, also referred to as D/A converters or DACs, are manufactured in large quantities for use in applications ranging from motor control to the synthesis of audio and video signals. DACs are classified according to the number of bits of digital input they convert, e.g. a five-bit DAC accepts five-bit digital input.

Ideally, the output of a DAC varies linearly between a minimum value and a maximum or full-scale value. Nonlinearity, also referred to as integral nonlinearity, can be defined as the maximum deviation of the actual output from the ideal output. Nonlinearity is an important performance parameter. DAC manufacturers often guarantee that the nonlinearity of their products will not exceed a specified limit, and test their products to ensure compliance with this limit.

A conventional test method supplies all digital input values in sequence to the DAC and measures the corresponding output values. A problem with this conventional method is that testing an n-bit DAC requires $2^n$ separate measurements. Testing a five-bit DAC, for example, requires thirty-two measurements, while a ten-bit DAC requires one thousand twenty-four measurements. Even with a computer-controlled test and measurement system, performing this large a number of measurements takes time, so that nonlinearity testing becomes expensive and impedes productivity.

SUMMARY OF THE INVENTION

It is accordingly an object of the present invention to reduce the number of measurements needed to test the linearity of a digital-to-analog converter or DAC.

The test method of the present invention tests a DAC that uses equally-weighted signal sources to convert high-order bits of digital input, and unequally-weighted signal sources to convert low-order bits. The test method comprises the following steps.

First, minimum and maximum digital inputs are supplied to the digital-to-analog converter, and the resulting minimum and maximum analog output values are measured.

Next, a linear input-output characteristic having these minimum and maximum analog output values as endpoints is calculated.

The high-order bits of the digital input are then varied while the low-order bits are held constant, and the deviations of the resulting analog output values from the linear input-output characteristic are calculated. These deviations form a first set of deviations.

Next, the low-order bits of the digital input are varied while the high-order bits are held constant, and the deviations of the resulting analog output values from the linear input-output characteristic are calculated. These deviations form a second set of deviations.

Finally, the maximum absolute deviation that can be obtained by adding a deviation in the first set to a deviation in the second set is calculated. This maximum absolute deviation is the nonlinearity error.

The invented test apparatus of the present invention comprises a data generator for generating digital input to the DAC, a measuring device for measuring the analog output from the DAC, and a computer or other control system for controlling the data generator and performing calculations as described above on the values measured by the measuring device.

DETAILED DESCRIPTION OF THE PREFERRED EMBODIMENTS

Embodiments of the method and apparatus in accordance with the present invention will be described with reference to the attached illustrative drawings, following a general description of the internal structure of a DAC.

The type of DAC tested by the invention produces an output signal by combining the outputs of a number of signal sources. These may be either current sources or voltage sources. Current sources will be shown in the following description.

A simple n-bit DAC comprises $2^n-1$ identical current sources which can be switched on or off individually. In response to a digital input value m, the first m of these current sources are switched on, and their output currents are combined to produce an output signal. This simple structure is disadvantageous because it has a separate switch for each current source, requiring a large number of switches and switch control circuitry.

A more efficient design employs n individually-switched, unequally-weighted current sources that produce successively doubling output currents, which can be combined to obtain the correct output signal for any input value from zero to $2^n-1$. Each input bit switches one current source on or off. This design is also disadvantageous, because of the disproportionately large error produced by the most heavily-weighted current sources.

Figure 1:
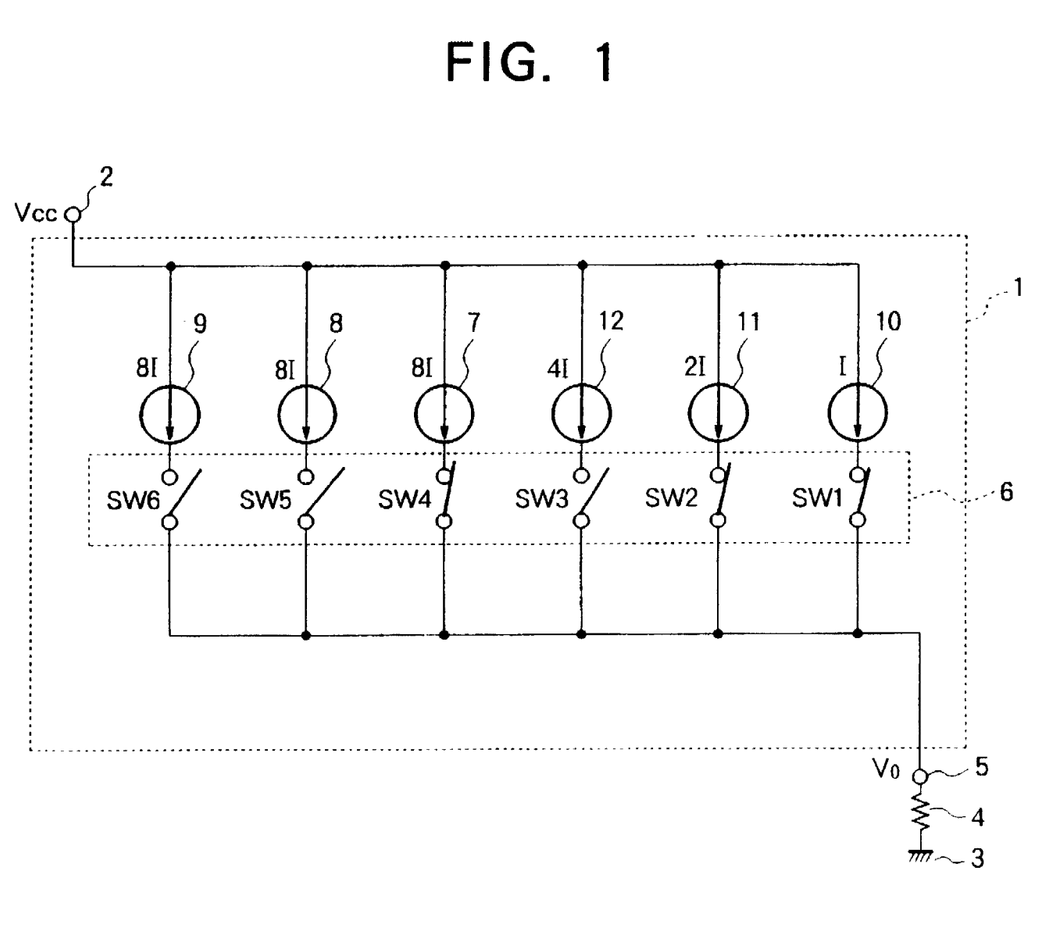
FIG. 1 is a schematic diagram of a five-bit DAC.

A compromise between these two schemes is therefore often employed, as illustrated for a five-bit DAC in FIG. 1.

This DAC 1 has a power supply (Vcc) terminal 2, and is coupled to ground 3 through a load resistor 4 attached to an output terminal 5. The output terminal 5 is coupled internally to a switching section 6 comprising six parallel switches SW1 to SW6.

Switches SW4, SW5, and SW6 are controlled by the two high-order (most significant) input bits, and are coupled to three equally-weighted current sources 7, 8, and 9. Switches SW1, SW2, and SW3 are controlled individually by the three low-order (least significant) input bits, and are coupled to three unequally-weighted current sources 10, 11, and 12. The letter I in FIG. 1 denotes the current produced by current source 10. Current sources 11 and 12 produce currents of 2I and 4I, respectively, while current sources 7, 8, and 9 produce equal currents of 8I.

Figure 2:
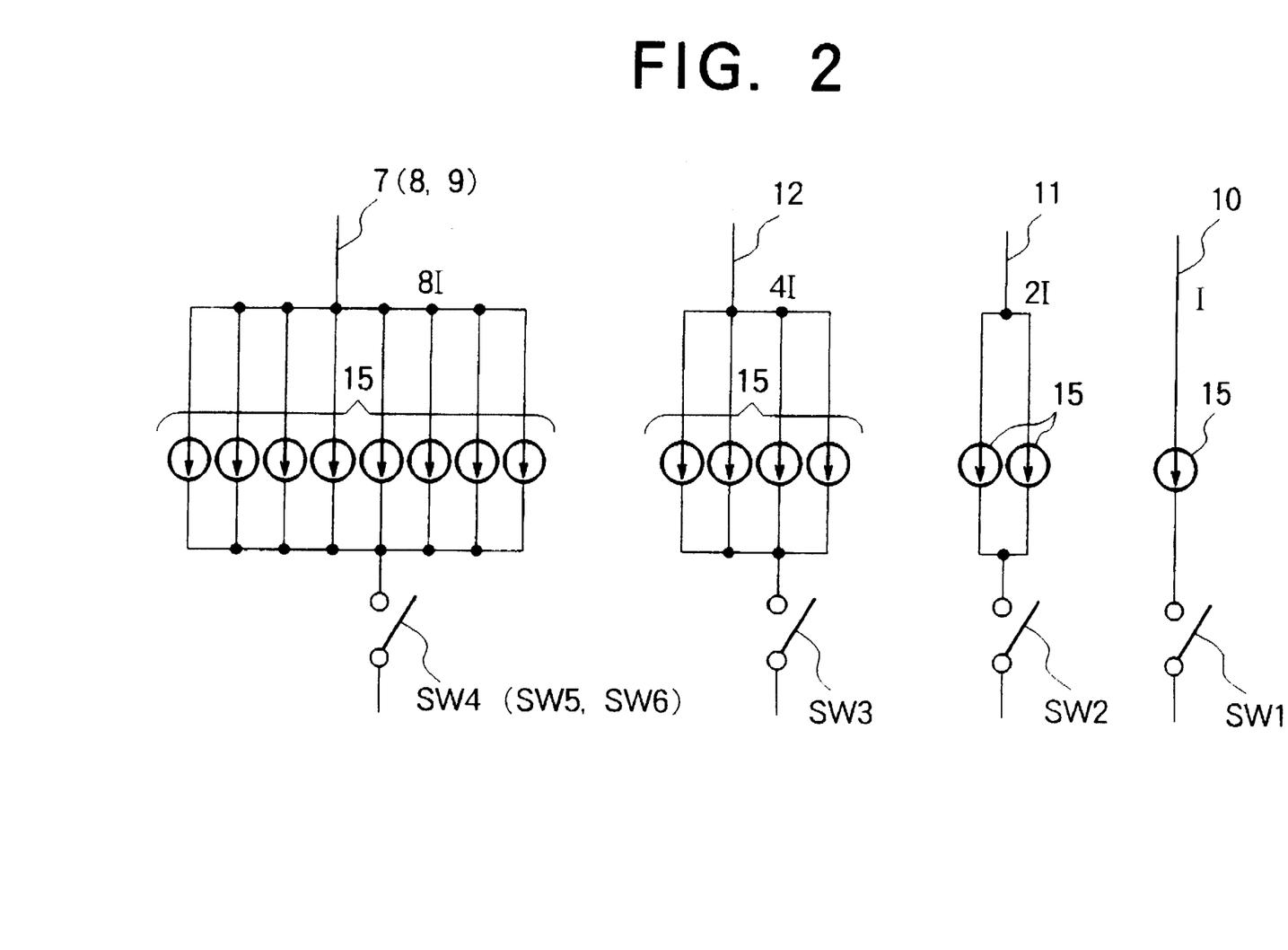
FIG. 2 illustrates the weighting of the current sources in FIG. 1.

FIG. 2 illustrates the weighting of the current sources schematically, using the same reference numerals and other symbols as in FIG. 1, and representing the current sources in terms of a unit current source 15 that generates the current I. Current source 10 comprises one unit current source 15. Current sources 7, 8, 9, 11, and 12 comprise appropriate numbers of unit current sources 15 coupled in parallel.

Figure 3:
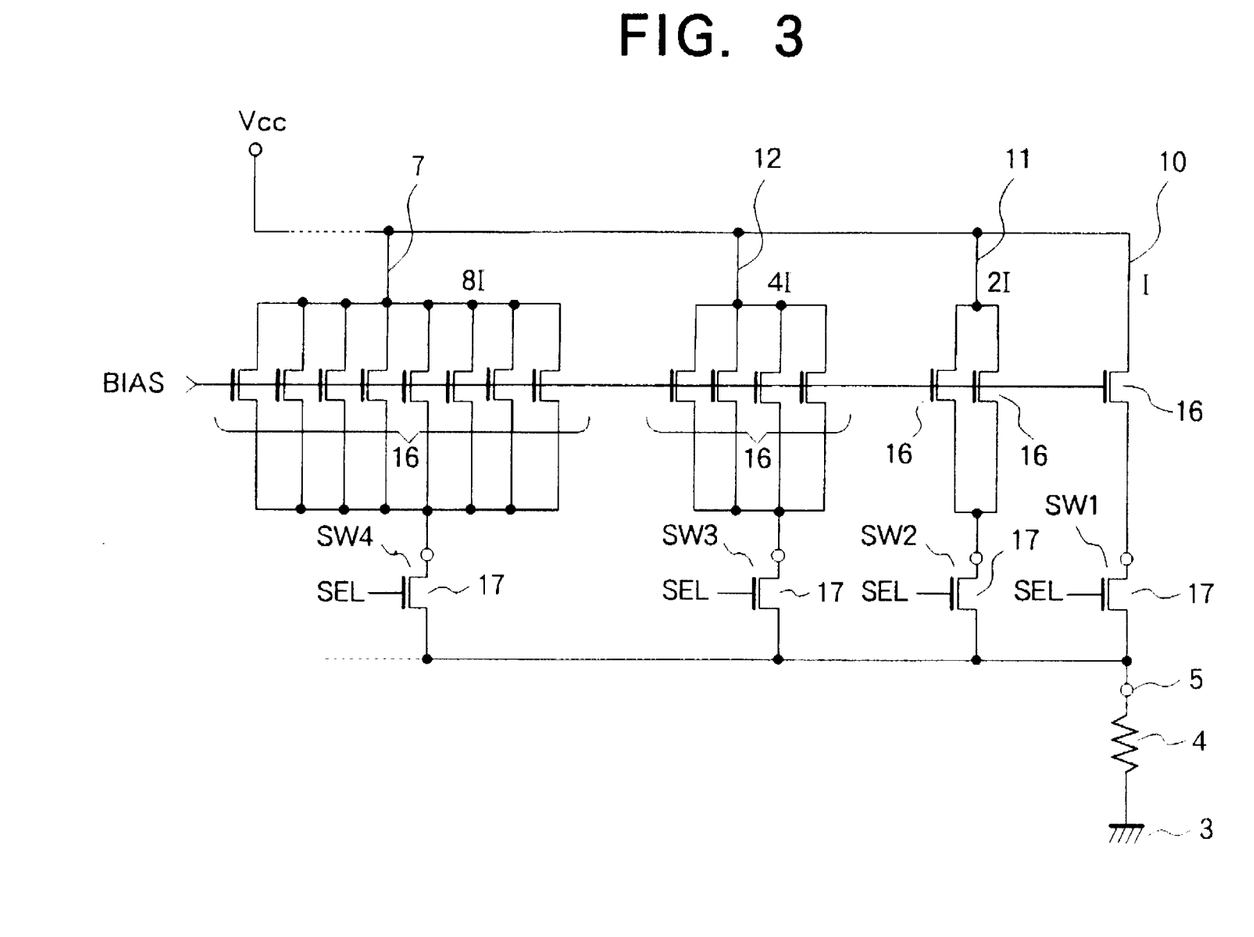
FIG. 3 is a more detailed schematic diagram of the DAC in FIG. 1.

FIG. 3 illustrates the actual circuit configuration of this five-bit DAC, again using the same reference numerals and symbols as in FIG. 1. Current sources 8 and 9 are omitted, but are similar in structure to current source 7. The unit current sources are identical field-effect transistors 16, the gate electrodes of which are biased at a fixed potential. The switches SW1 to SW6 are field-effect transistors 17, the gate electrodes of which receive selection signals (SEL) generated from the five input bits.

Table 1 indicates which switches are switched on and off in response to each digital input value from zero (binary '00000') to thirty-one (binary '11111'). It can be verified from this table that the current supplied to the load resistor 4 is in proportion to the input value. The voltage at output terminal 5 is therefore also in proportion to the input value.

For example, if the input is zero, all six switches SW1 to SW6 are off, no current flows through load resistor 4, and the output voltage is zero (ground level).

If the input value is one (binary '00001'), only switch SW1 is on, so the unit current I flows across load resistor 4, producing an output voltage equal to I×R, where R is the resistance value of load resistor 4.

If the input value is thirty-one, all six switches are on, and the output current is:

$$(8I+8I+8I+4I+2I+I)\times R=31(I\times R)$$

TABLE 1

| Input | Decimal | SW1 | SW2 | SW3 | SW4 | SW5 | SW6 |
|---|---|---|---|---|---|---|---|
| 00000 | 0 | OFF | OFF | OFF | OFF | OFF | OFF |
| 00001 | 1 | ON | OFF | OFF | OFF | OFF | OFF |
| 00010 | 2 | OFF | ON | OFF | OFF | OFF | OFF |
| 00011 | 3 | ON | ON | OFF | OFF | OFF | OFF |
| 00100 | 4 | OFF | OFF | ON | OFF | OFF | OFF |
| 00101 | 5 | ON | OFF | ON | OFF | OFF | OFF |
| 00110 | 6 | OFF | ON | ON | OFF | OFF | OFF |
| 00111 | 7 | ON | ON | ON | OFF | OFF | OFF |
| 01000 | 8 | OFF | OFF | OFF | ON | OFF | OFF |
| 01001 | 9 | ON | OFF | OFF | ON | OFF | OFF |
| 01010 | 10 | OFF | ON | OFF | ON | OFF | OFF |
| 01011 | 11 | ON | ON | OFF | ON | OFF | OFF |
| 01100 | 12 | OFF | OFF | ON | ON | OFF | OFF |
| 01101 | 13 | ON | OFF | ON | ON | OFF | OFF |
| 01110 | 14 | OFF | ON | ON | ON | OFF | OFF |
| 01111 | 15 | ON | ON | ON | ON | OFF | OFF |
| 10000 | 16 | OFF | OFF | OFF | ON | ON | OFF |
| 10001 | 17 | ON | OFF | OFF | ON | ON | OFF |
| 10010 | 18 | OFF | ON | OFF | ON | ON | OFF |
| 10011 | 19 | ON | ON | OFF | ON | ON | OFF |
| 10100 | 20 | OFF | OFF | ON | ON | ON | OFF |
| 10101 | 21 | ON | OFF | ON | ON | ON | OFF |
| 10110 | 22 | OFF | ON | ON | ON | ON | OFF |
| 10111 | 23 | ON | ON | ON | ON | ON | OFF |
| 11000 | 24 | OFF | OFF | OFF | ON | ON | ON |
| 11001 | 25 | ON | OFF | OFF | ON | ON | ON |
| 11010 | 26 | OFF | ON | OFF | ON | ON | ON |
| 11011 | 27 | ON | ON | OFF | ON | ON | ON |
| 11100 | 28 | OFF | OFF | ON | ON | ON | ON |
| 11101 | 29 | ON | OFF | ON | ON | ON | ON |
| 11110 | 30 | OFF | ON | ON | ON | ON | ON |
| 11111 | 31 | ON | ON | ON | ON | ON | ON |

Figure 4:
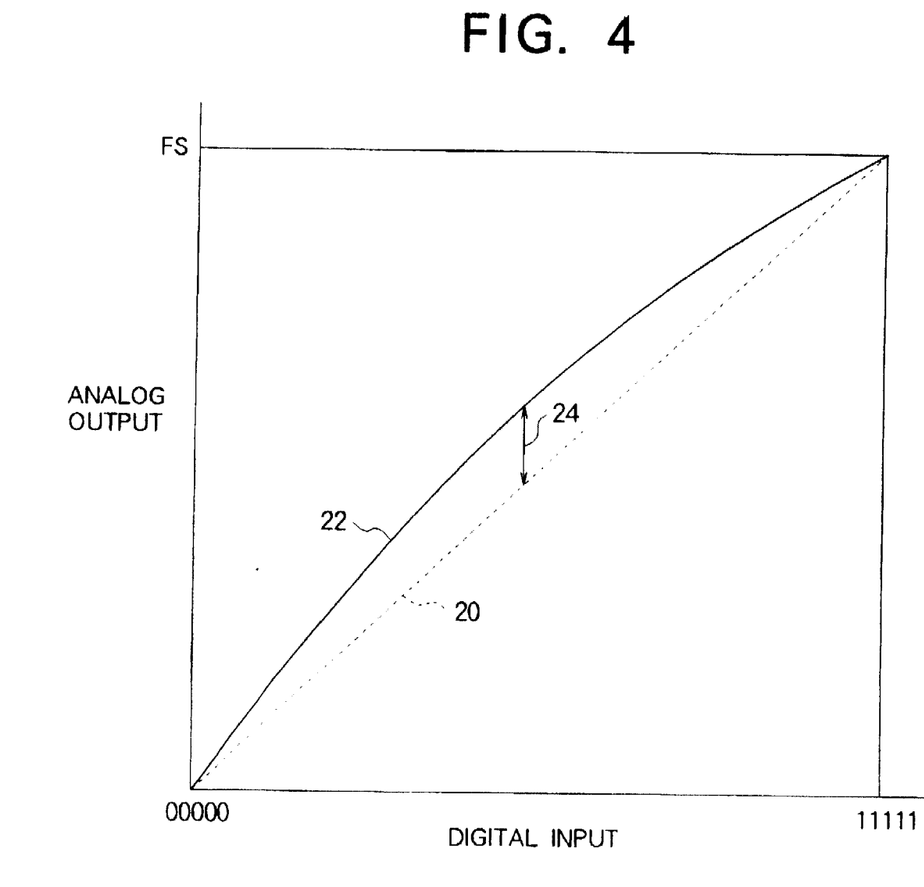
FIG. 4 illustrates the definition of nonlinearity.

The nonlinearity of the DAC in FIG. 1 can be defined as shown in FIG. 4. The horizontal axis indicates the digital input value. The vertical axis indicates the analog output voltage, FS representing the full-scale value. The ideal input-output characteristic 20 is a straight line, but the actual input-output characteristic 22 measured in a test is in general not straight. The maximum deviation 24 between the ideal and actual output values represents the degree of non-straightness or nonlinearity.

Figure 5:
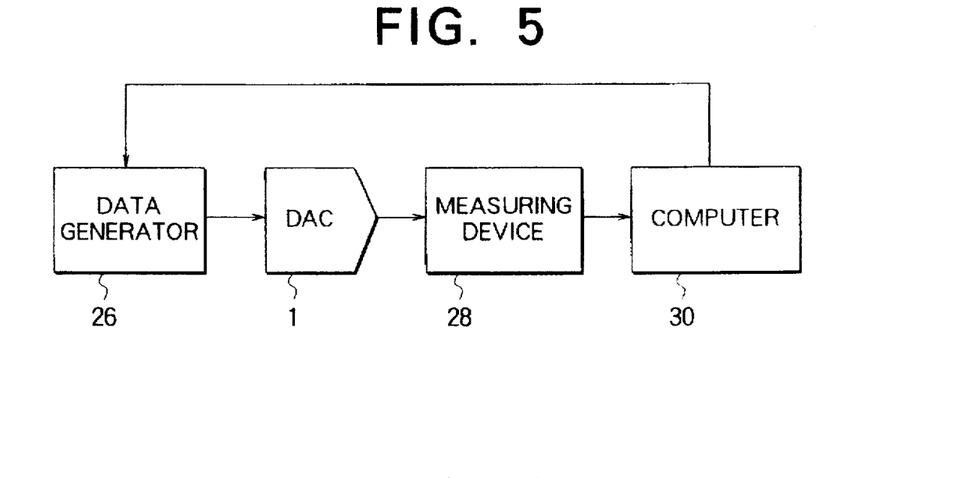
FIG. 5 is a block diagram of a first embodiment of the test apparatus of the present invention.

FIG. 5 illustrates the basic configuration of the invented nonlinearity test apparatus. A data generator 26 supplies the five-bit DAC 1 with input data. A measuring device 28, essentially an accurate analog-to-digital converter, measures the resulting analog output, and supplies output values to a computer 30. The computer 30 controls the data generator 26 and obtains a test result by executing a program that is described subsequently.

Figure 6:
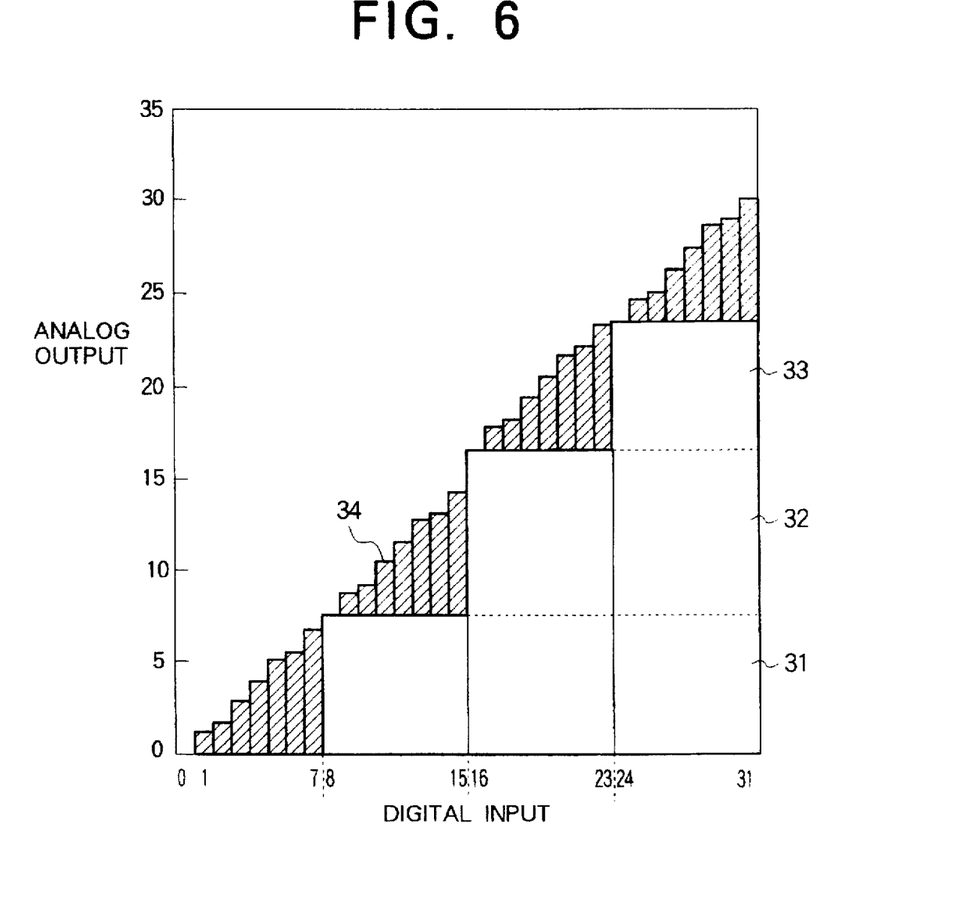
FIG. 6 shows an example of measured outputs obtained from a five-bit DAC.

FIG. 6 shows an example of the type of analog output actually obtained from a five-bit DAC 1 in response to input values from zero to thirty-one. The input values are indicated on the horizontal axis. The output values are indicated as multiples of I×R on the vertical axis. Horizontal white bars 31, 32, and 33 represent the contributions of current sources 7, 8, and 9, respectively, to these output values. Vertical cross-hatched bars 34 represent the combined contributions of current sources 10, 11, and 12.

Due to manufacturing variability, current sources 7, 8, and 9 are in general not perfectly identical, so bars 31, 32, and 33 have different heights. Similarly, the weighting of current sources 10, 11, and 12 is not in a perfect 1:2:4 ratio, so the pattern of increase of the hatched bars 34 is not perfectly regular. The same irregular pattern of hatched bars 34 appears four times, in the input ranges 0–7, 8–15, 16–23, and 24–31. This is because, as shown in Table 1, switches SW1, SW2, and SW3 are switched on in the same pattern for input values from one to seven, from nine to fifteen, from seventeen to twenty-three, and from twenty-five to thirty-one. For input values of zero, eight, sixteen, and twenty-four, switches SW1, SW2, and SW3 are all switched off, so the analog output is entirely due to current sources 7, 8, and 9.

The contribution of the equally-weighted current sources 7, 8, and 9 to the analog output is constant within each of the four input ranges 0–7, 8–15, 16–23, and 24–31. In the 0–7 input range, where switches SW4, SW5, and SW6 are all off, this contribution is zero. In the 8–15 range, where SW4 is on but SW5 and SW6 are off, the contribution of current source 7 is uniformly present. In the 16–23 range, where SW4 and SW5 are on but SW6 is off, the combined contribution of current sources 7 and 8 is uniformly present. In the 24–31 range, where SW4, SW5, and SW6 are all on, the combined contribution of current sources 7, 8, and 9 is uniformly present.

It follows that the output errors produced for all input values can be calculated from the errors produced by the three equally-weighted current sources 7, 8, and 9, and the errors produced by the three unequally-weighted current source 10, 11, and 12. The test method of the present invention therefore measures the various combined errors produced by the three equally-weighted current sources 7, 8, and 9, measures the various combined errors produced by the three unequally-weighted current source 10, 11, and 12, then finds the maximum total error that can be produced by adding the pairs of measured error values.

Although FIG. 6 shows an output value of zero when the digital input is zero, in general there may be a zero offset due to current leakage. A zero offset is not considered to be a linearity error.

Figure 7A:
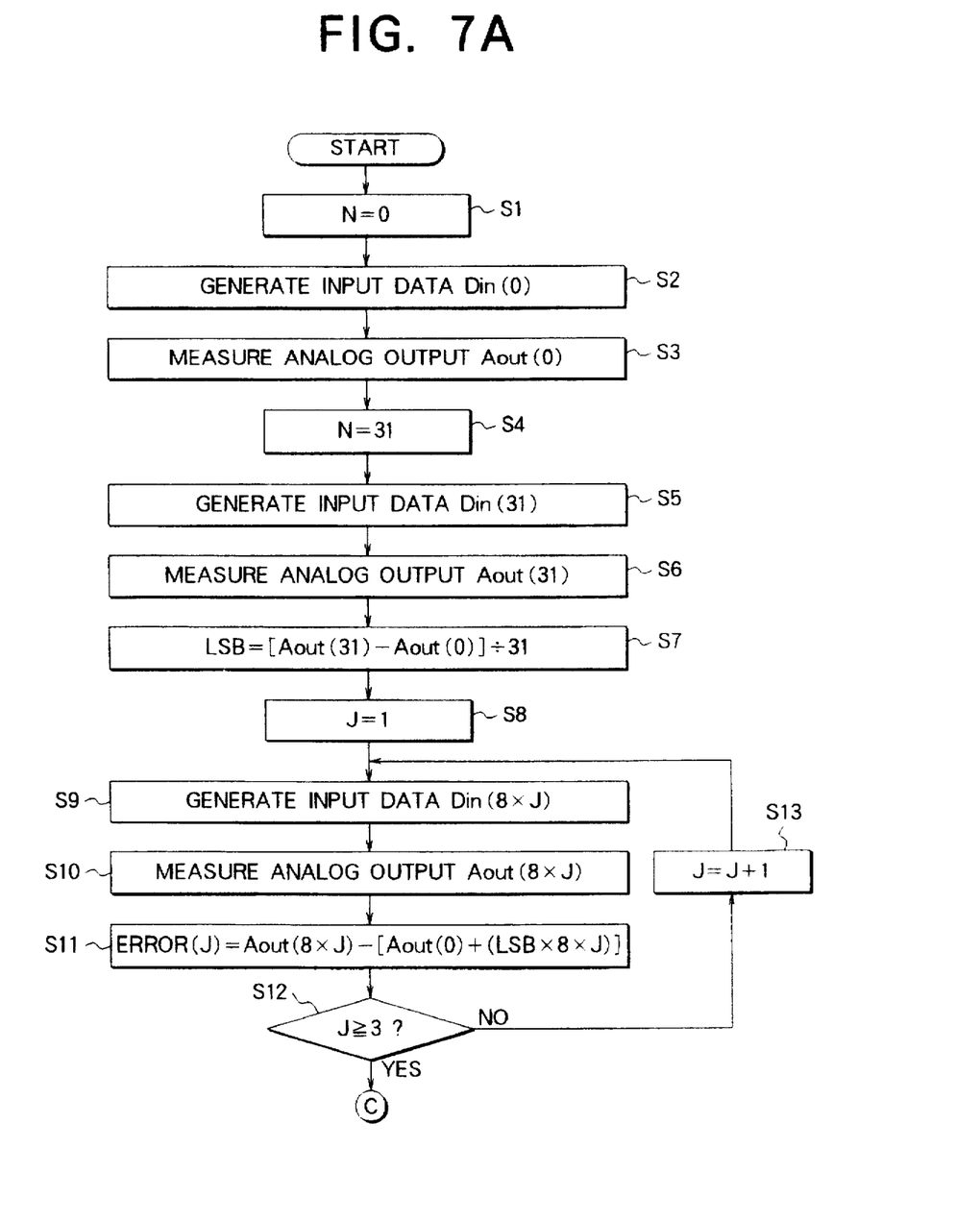
FIGS. 7A and 7B are a flowchart of the test method followed in the first embodiment.
Figure 7B:
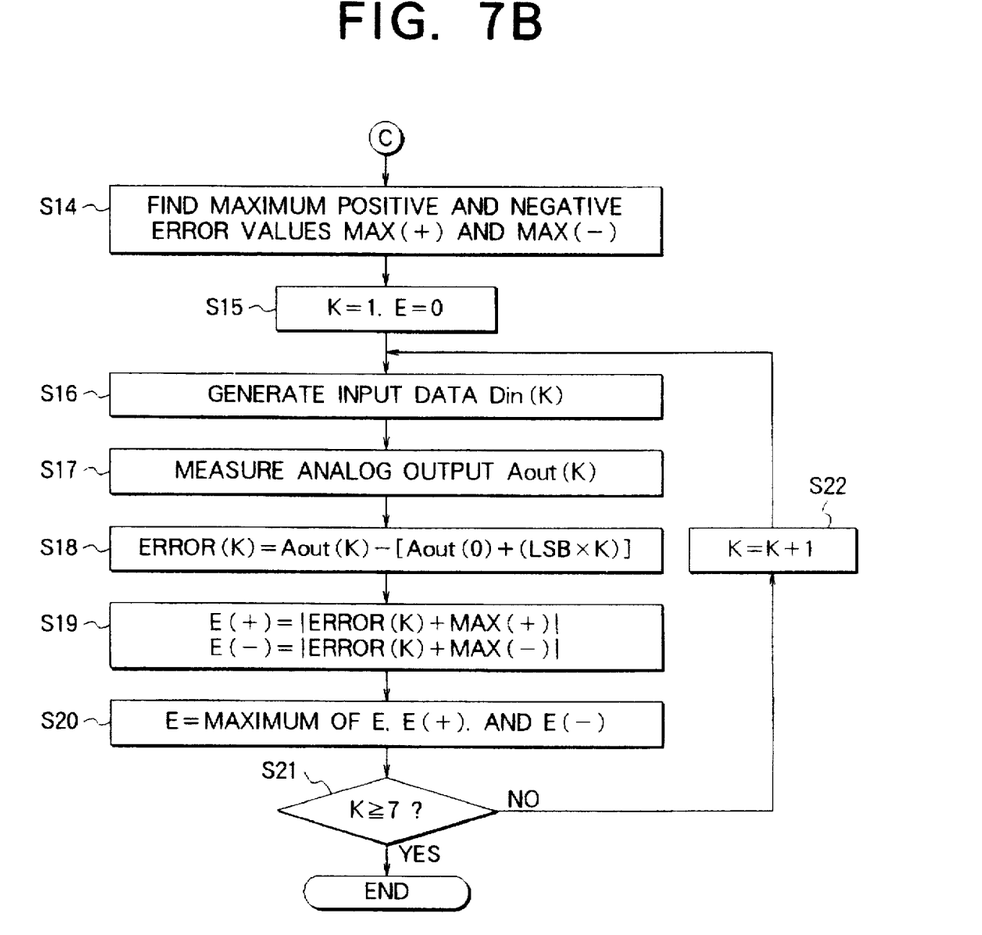

FIGS. 7A and 7B are a flowchart of the control program executed by the computer 30 in FIG. 5.

Steps S1 to S7 in FIG. 7A determine an ideal input-output characteristic by finding the minimum and maximum output values and calculating the increment that would be produced by one least significant bit (LSB) of digital input if the input-output characteristic were linear. This increment will be referred to below as the ideal LSB value, and will be denoted LSB in equations.

In step S1, a counter value N is set to the minimum input value of zero. In step S2, the computer 30 commands the data generator 26 to generate the corresponding input data Din(0), and the data generator 26 generates the binary data '00000.' In step S3, the resulting output Aout(0) is measured by the measuring device 28 and stored by the computer 30.

Similarly, in step S4, N is set to the maximum input value of thirty-one. In step S5, the data generator 26 generates input data Din(31), or binary '11111.' In step S6, the resulting output Aout(31) is measured and stored. Then in step S7, the computer 30 calculates the ideal LSB value by dividing the difference between Aout(31) and Aout(0) by thirty-one. If the input-output characteristic were truly linear, then each output value Aout(N) would be equal to Aout(0)+(LSB×N).

Steps S8 to S14 determine the maximum positive and negative nonlinearity errors due to the equally-weighted current sources 7, 8, and 9, by holding the three low-order input bits constant at zero, varying the two high-order bits through the values '01,' '10,' and '11,' and measuring the resulting analog outputs. The three digital input values are eight (binary '01000'), sixteen (binary '10000'), and twenty-four (binary '11000').

In step S8, a counter value J is set to 1. In step S9, the computer 30 commands the data generator 26 to generate digital input data Din(8×J). In step S10, the resulting analog output Aout(8×J) is measured and stored. In step S11 the analog output error ERROR(8×J) is calculated as the difference between Aout(8×J) and [Aout(0)+(LSB×8×J)]. The value of J is then tested in step S12. If J is less than three, J is incremented in S13 and the process returns to step S9.

The process from steps S9 to S13 is carried out three times, obtaining ERROR(8), ERROR(16), and ERROR(24). Step S14 in FIG. 7B then determines the maximum positive value MAX(+) among these three error values, and the maximum negative value MAX(−) (the negative value furthest from zero) among the same three error values.

Figure 8:
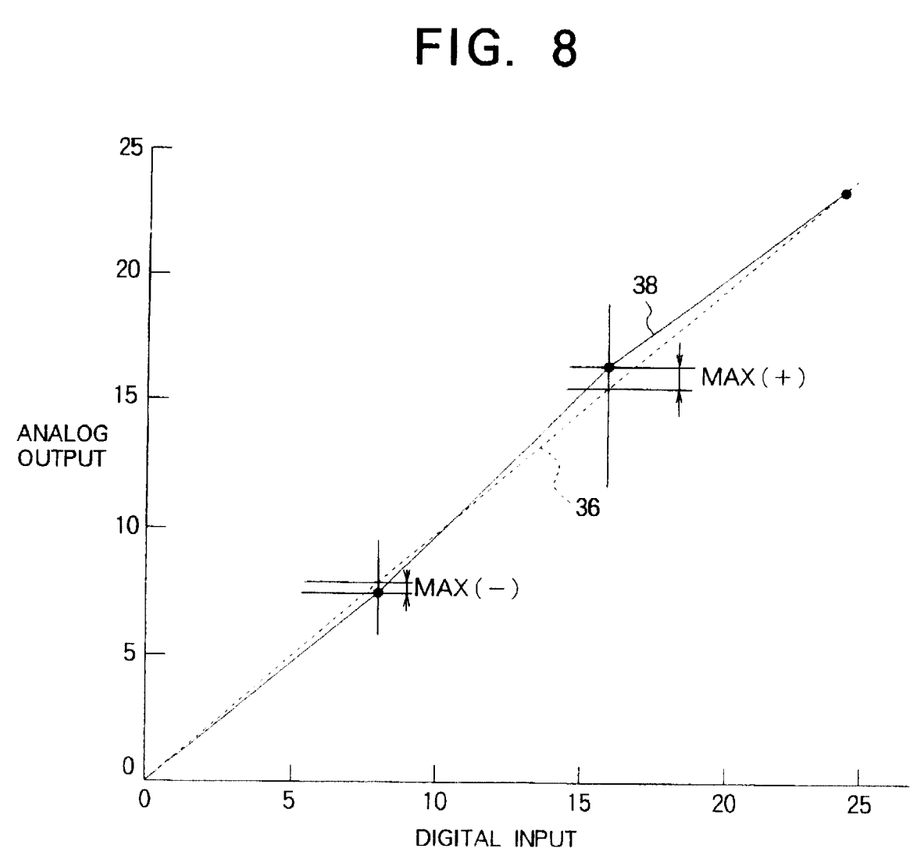
FIG. 8 illustrates the calculation of maximum positive and negative errors due to equally-weighted current sources.

FIG. 8 shows an example of these error determinations. The digital input value is indicated on the horizontal axis, and the measured analog output value on the vertical axis. The dotted line 36 is the ideal input-output characteristic determined by measuring Aout(0) and Aout(31). Aout(0) is equal to zero in this example. The solid line 38 is plotted through Aout(0), Aout(8), Aout(16), and Aout(24). Aout(24) agrees with the ideal value, while Aout(16) is slightly higher and Aout(8) is slightly lower. The maximum positive error MAX(+) is the difference between Aout(16) and the ideal value, while the maximum negative error MAX(−) is the difference between Aout(8) and the ideal value.

Referring again to FIG. 7B, steps S15 to S22 measure the analog outputs resulting from all combinations of the unequally-weighted current sources, find the deviation of these output values from the ideal values, then add these deviations to the maximum positive and negative errors MAX(+) and MAX(−) determined above, and find the greatest absolute value among the resulting sums. During this part of the test the two high-order bits of the digital input are held constant at zero, and the three low-order bits are varied through values from one (binary '001') to seven (binary '111').

In step S15, a counter value K is set to one, and a maximum absolute error value E is set to zero. In step S16, the computer 30 commands the data generator 26 to generate digital input data Din(K). In step S17, the resulting analog output Aout(K) is measured and stored. In step S18 the analog output error ERROR(K) is calculated as the difference between Aout(K) and [Aout(0)+(LSB×K)]. In step S19 ERROR(K) is added to MAX(+) and MAX(−), and the absolute values E(+) and E(−) of these two sums are taken. In step S20, if either of these absolute values is greater than E, E is updated to the larger of these values E(+) and E(−). The value of K is then tested in step S21. If K is less than seven, K is incremented in S22 and the process returns to step S16.

The process from steps S16 to S22 is carried out seven times, at the end of which the value of E is equal to the maximum absolute value that can be produced by adding an error due to current sources 7, 8, and 9 to an error due to current sources 10, 11, and 12. This final value of E is the nonlinearity of the DAC under test.

The total number of measurements in this test is twelve: two measurements of the maximum and minimum values Aout(0) and Aout(31); three more measurements of Aout(8), Aout(16), and Aout(24) to find the error due to current sources 7, 8, and 9; and seven more measurements to find the error due to current sources 10, 11, and 12. This compares favorably with the thirty-two measurements required by the conventional method.

If the same method is applied to a ten-bit DAC with three unequally-weighted current sources for the three least significant bits and one hundred twenty-seven ($2^7-1$) equally-weighted current sources for the seven most significant bits, the required number of measurements is one hundred thirty-six, which compares very favorably with the conventional one thousand twenty-four.

The method of the present invention also reduces the necessary amount of computation.

As these examples show, for a given number of unequally-weighted current sources, the more equally-weighted current sources there are, the more time is saved by the of the present invention test method. The of the present invention method is accordingly particularly useful in testing high-precision DACs, which have many equally-weighted current sources.

The procedure shown in FIGS. 7A and 7B can be varied as follows. After the maximum positive and negative errors MAX(+) and MAX(−) due to the equally-weighted current sources 7, 8, and 9 have been found in step 14, the maximum positive and negative errors MAX2(+) and MAX2(−) due to the unequally-weighted current sources 10, 11, and 12 can be found by a similar procedure, and the nonlinearity calculated as the larger of the two sums |MAX(+)+MAX2(+)| and |MAX(−)+MAX2(−)|.

Figure 9:
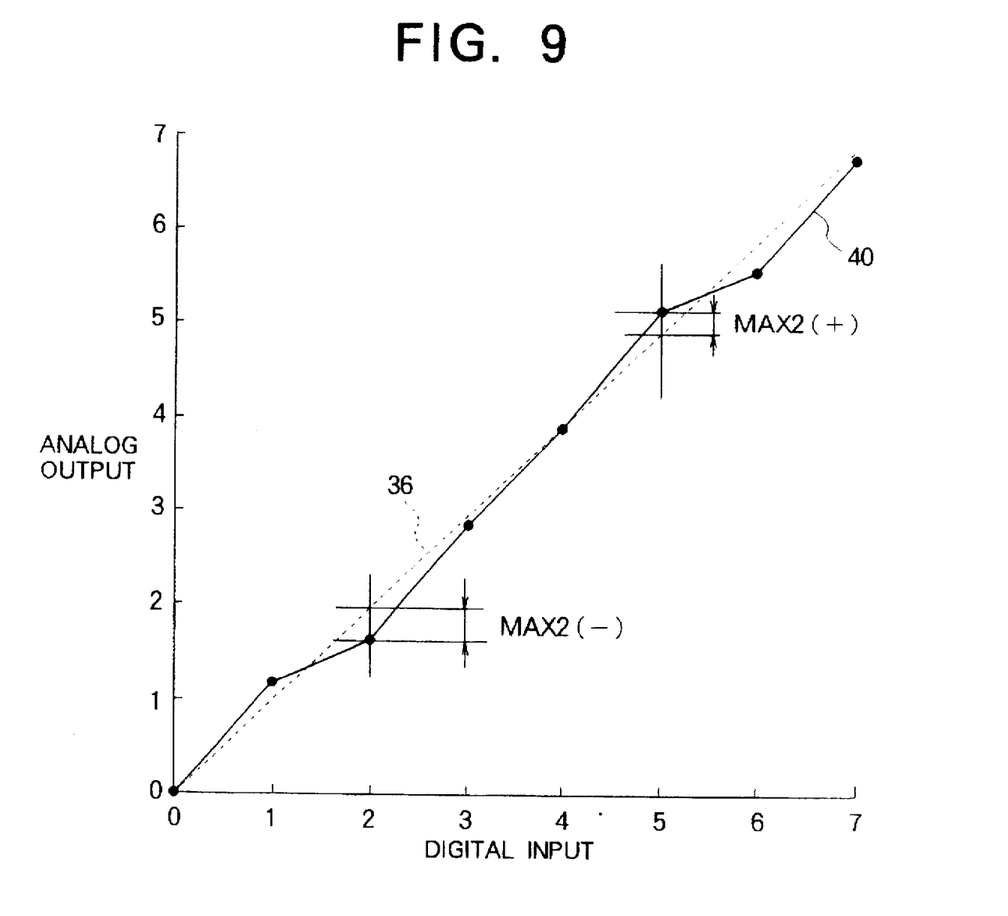
FIG. 9 illustrates the calculation of maximum positive and negative errors due to unequally-weighted current sources.

FIG. 9 illustrates the determination of MAX2(+) and MAX2(−) in this variation, showing digital input on the horizontal axis and analog output on the vertical axis. The dotted line 36 again represents the ideal input-output characteristic. The black dots on line 40 indicate the actual analog output values Aout(K) measured in response to input values (K) from one to seven. In this example, maximum positive deviation from the ideal is obtained when the input value is five, and maximum negative deviation when the input value is two. MAX2(+) is the difference between Aout(5) and the ideal value, while MAX2(−) is the difference between Aout(2) and the ideal value.

Figure 10:
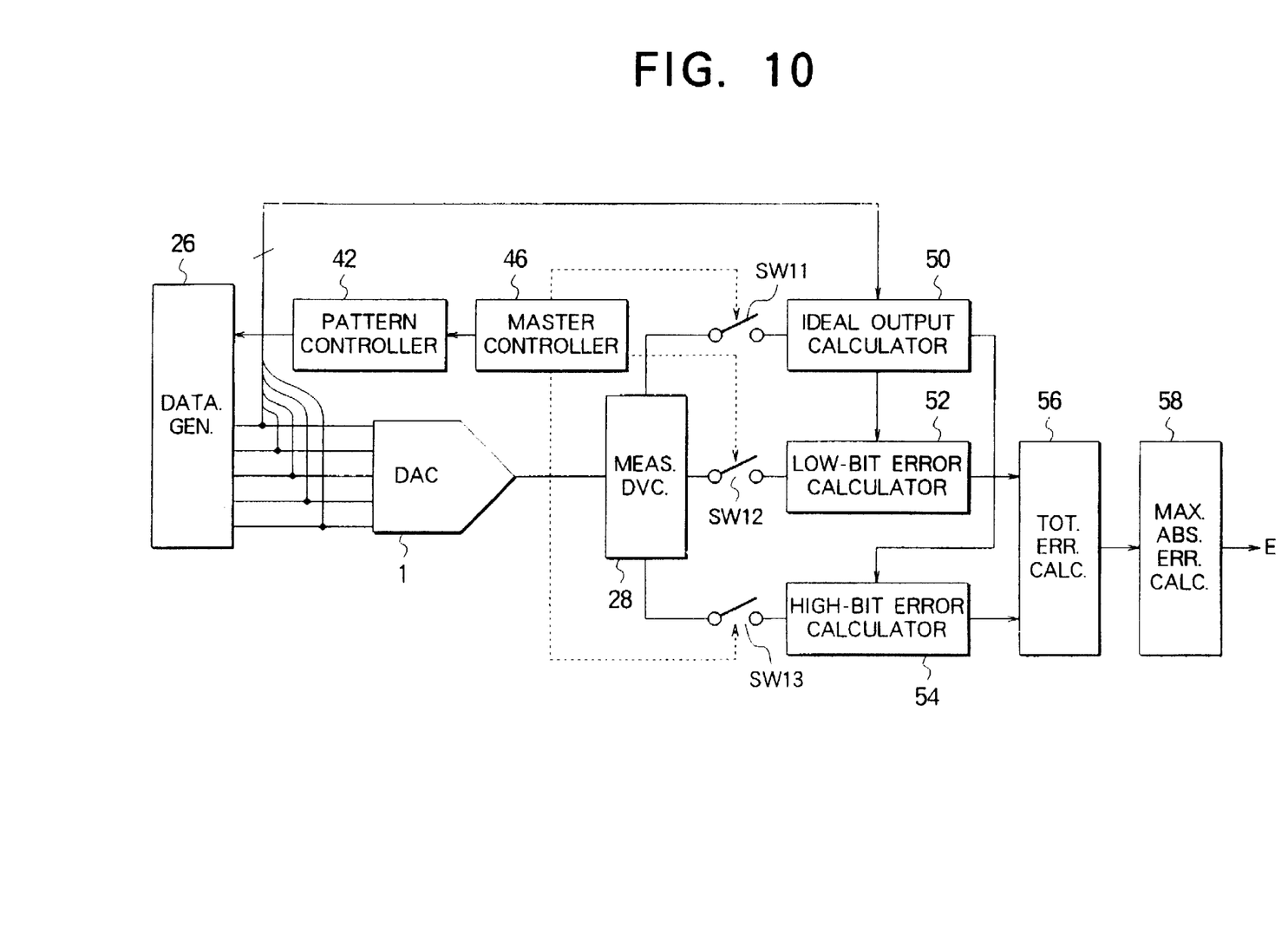
FIG. 10 is a block diagram of a second embodiment of the test apparatus of the present invention.

FIG. 10 shows another embodiment of the test apparatus of the present invention, which is adapted to carry out the above variation of the test method. The five-bit DAC 1, data generator 26, and measuring device 28 are the same as in FIG. 5. The other elements in FIG. 10 replace the computer 30 in FIG. 5.

The data generator 26 in FIG. 10 is controlled by a pattern controller 42, which is in turn controlled by a master controller 46. The values measured by the measuring device 28 are supplied to three switches SW11, SW12, and SW13, which are also controlled by the master controller 46. Switch SW11 is coupled to an ideal output calculator 50, which calculates a linear input-output characteristic. Switch SW12 is coupled to a low-bit error calculator 52, which calculates the maximum positive and negative errors due to the unequally-weighted current sources. SW13 is coupled to a high-bit error calculator 54, which calculates the maximum positive and negative errors due to the equally-weighted current sources. From the outputs of these two error calculators 52 and 54, a total error calculator 56 calculates the maximum positive and negative errors due to all current sources combined. A maximum absolute error calculator 58 then selects the larger of these two combined errors and outputs the selected value as the nonlinearity error value E.

Figure 11:
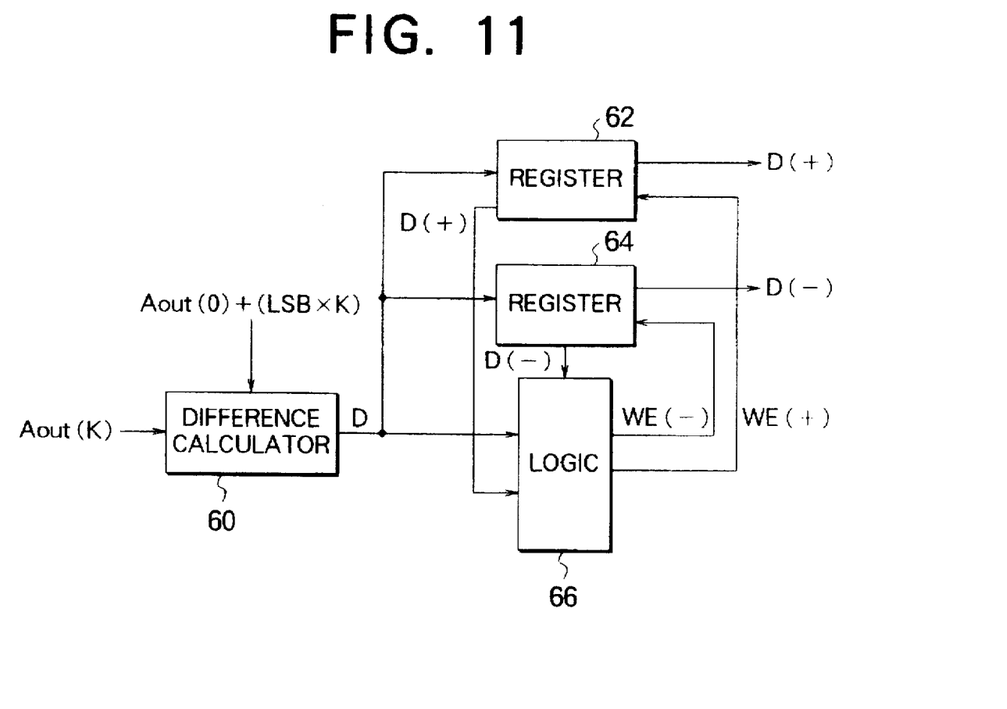
FIG. 11 is a more detailed block diagram of the low-bit and high-bit error calculators in FIG. 10.

The low- and high-bit error calculators 52 and 54 both have the internal structure shown in FIG. 11. A difference calculator 60 receives an ideal value [Aout(0)+(LSB×K)] from the ideal output calculator 50, receives a measured analog output value Aout(K) via switch SW12 or SW13, calculates the signed difference D between the measured and ideal values, and sends this difference D to a pair of registers 62 and 64 and a decision logic circuit 66. The decision logic circuit 66 compares D with the existing contents of registers 62 and 64 and, under appropriate conditions, outputs a write enable signal WE to one register or the other. Register 62 stores and outputs positive (or zero) values, denoted D(+). Register 64 stores and outputs negative (or zero) values, denoted D(−).

Figure 12:
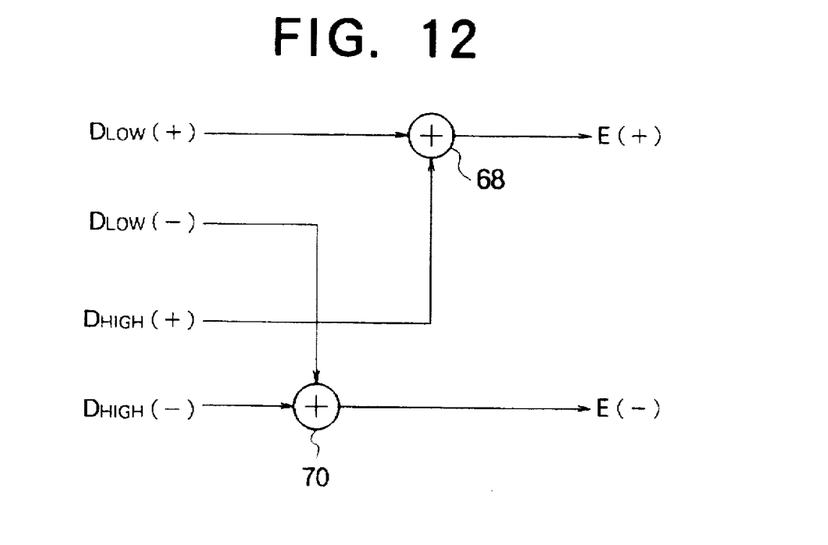
FIG. 12 is a more detailed block diagram of the total error calculator in FIG. 10.

FIG. 12 shows the internal structure of the total error calculator 56, which comprises a pair of adders 68 and 70.

Next the operation of the test apparatus in FIG. 10 will be described, with reference to FIGS. 10, 11, and 12.

To begin the test, the registers 62 and 64 in both the low- and high-bit error calculators 52 and 54 are cleared to zero. Next, the ideal LSB value is determined as follows. The master controller 46 closes switch SW11, opens switches SW12 and SW13, and signals the pattern controller 42 to generate a test pattern consisting of the minimum and maximum input values, zero and thirty-one. The pattern controller 42 sends these two values, at separate times, to the data generator 26, which generates binary input data Din(0) and Din(31). These two digital inputs are supplied to both the five-bit DAC 1 and ideal output calculator 50.

The measuring device 28 measures the resulting analog output values Aout(0) and Aout(31) and sends them via switch SW11 to the ideal output calculator 50, which calculates the ideal LSB value as [Aout(31)−Aout(30)]/31, as in the first embodiment. Thereafter, when the ideal output calculator 50 receives an input value K from the data generator 26, it multiplies the ideal LSB value by K, adds Aout(0), and supplies the sum Aout(0)+(LSB×K) as an ideal value to the low- and high-bit error calculators 52 and 54.

The master controller 46 next opens switch SW11, closes switch SW13, and signals the pattern controller 42 to generate a test pattern for calculating the error due to the equally-weighted current sources. The pattern controller 42 sends the necessary values (eight, sixteen, and twenty-four) to the data generator 26, which generates digital inputs Din(8), Din(16), and Din(24) at different times. The measuring device 28 measures the resulting analog output values and supplies them through switch SW13 to the high-bit error calculator 54. The output values will be denoted Aout(K), where K is one of the three values eight, sixteen, and twenty-four.

The difference calculator 60 in the high-bit error calculator 54 receives each actual output value Aout(K) from switch SW13, together with the corresponding ideal value Aout(0)+(LSB×K) from the ideal output calculator 50, and subtracts the ideal value from the actual value to calculate the difference D. The decision logic circuit 66 compares D with the existing contents D(+) and D(−) of registers 62 and 64. If D is greater than D(+), the decision logic circuit 66 sends a write enable signal WE(+) to register 62, causing register 62 to update D(+) by replacing the existing value of D(+) with the new value D. If D is less than D(−), the decision logic circuit 66 sends a write enable signal WE(−) to register 64, causing register 64 to update D(−) to the new value D. If D(−)≦D≦D(+), the decision logic circuit 66 leaves both write enable signals WE(+) and WE(−) inactive, and the existing values of both D(−) and D(+) remain unchanged.

At the end of this procedure for all three values of K, the values of D(+) and D(−) in registers 62 and 64 in the high-bit error calculator 54 are the maximum positive and negative errors due to the equally-weighted current sources controlled by the high-order bits. These values will be denoted $D_{HIGH}(+)$ and $D_{HIGH}(-)$.

The master controller 46 next opens switch SW13, closes switch SW12, and signals the pattern controller 42 to generate a test pattern for calculating the error due to the unequally-weighted current sources. The pattern controller 42 sends values of K from one to seven to the data generator 26, which generates digital inputs from Din(1) to Din(7) at different timings. The measuring device 28 supplies the resulting analog output values through switch SW12 to the low-bit error calculator 52, which operates in the same way as the high-bit error calculator 54. The final values in registers 62 and 64 in the low-bit error calculator 52, which are the maximum positive and negative errors due to the unequally-weighted current sources, will be denoted $D_{LOW}(+)$ and $D_{LOW}(-)$.

In the total error calculator 56 (FIG. 12), adder 68 adds $D_{LOW}(+)$ to $D_{HIGH}(+)$ and supplies the resulting sum E(+) to the maximum absolute error calculator 58. Adder 70 adds $D_{LOW}(-)$ to $D_{HIGH}(-)$ and supplies the resulting sum E(−) to the maximum absolute error calculator 58. These two sums are the maximum positive and negative errors that the five-bit DAC 1 can produce. The maximum absolute error calculator 58 compares the absolute values of E(+) and E(−), and outputs whichever one has the larger absolute value as the nonlinearity error value E.

It is not necessary to add $D_{LOW}(+)$ to $D_{HIGH}(-)$, or add $D_{LOW}(-)$ to $D_{HIGH}(+)$, because the resulting sums would have smaller absolute values than E.

The apparatus shown in FIGS. 10 to 12 provides the same advantages as the apparatus in FIG. 5, testing the nonlinearity of a five-bit DAC with twelve measurements instead of thirty-two. This same apparatus can be adapted to test a DAC with any number of equally-weighted current sources and any number of unequally-weighted current sources, by altering the patterns output by the pattern controller 42.

The above test methods can be varied by testing the unequally-weighted current sources before the equally-weighted current sources.

When the equally-weighted current sources are tested, the low-order input bits can be set to all 1's instead of all 0's. Similarly, when the unequally-weighted current sources are tested, the high-order input bits can be set to all 1's instead of all 0's. More generally, to test the equally-weighted current sources, the low-order bits can be set to any fixed value while the high-order bits are varied, and to test the unequally-weighted current sources, the high-order bits can be set to any fixed value while the low-order bits are varied.

The apparatus of the first embodiment can be adapted to employ the method of the second embodiment, by altering the program executed by the computer 30.

The present invention is not limited to testing DACs that operate by adding currents. DACs that operate by adding voltages can be tested in the same way, if they employ equally-weighted voltage sources for the upper bits and unequally-weighted voltage sources for the lower bits.

Those skilled in the art will recognize that further variations are possible within the scope of the claimed invention.

What is claimed is:

1. A method of testing the linearity of a digital-to-analog converter that employs equally-weighted signal sources for converting high-order bits of digital input, and unequally-weighted signal sources for converting low-order bits of digital input, comprising the steps of:

supplying a minimum digital input and a maximum digital input to said digital-to-analog converter and measuring a resulting pair of analog outputs;

calculating a linear input-output characteristic having the pair of analog outputs as endpoints;

varying the high-order bits of digital input while holding the low-order bits of digital input constant, measuring resulting analog output values, and calculating deviations from the linear input-output characteristic of the analog output values thus measured, thereby obtaining a first set of deviations;

varying the low-order bits of digital input while holding the high-order bits of digital input constant, measuring resulting analog output values, and calculating deviations from the linear input-output characteristic of the analog output values thus measured, thereby obtaining a second set of deviations; and finding, among all total deviations obtainable by adding a deviation in the first set of deviations to a deviation in the second set of deviations, a total deviation of maximum absolute value.

2. The method of claim 1, wherein the low-order bits of digital input are held constant at zero during the step of varying the high-order bits, so that the analog output values measured during the step of varying the high-order bits are generated only from the equally-weighted signal sources.

3. The method of claim 1, wherein the high-order bits of digital input are held constant at zero during the step of varying the low-order bits, so that the analog output values measured during the step of varying the low-order bits are generated only from the unequally-weighted signal sources.

4. The method of claim 1, wherein the step of finding comprises the steps of:

finding a maximum positive deviation in the first set of deviations;

finding a maximum negative deviation in the first set of deviations;

adding the maximum positive deviation to each deviation in the second set of deviations; and adding the maximum negative deviation to each deviation in the second set of deviations.

5. The method of claim 1, wherein the step of finding comprises the steps of:

finding a first maximum positive deviation in the first set of deviations;

finding a first maximum negative deviation in the first set of deviations;

finding a second maximum positive deviation in the second set of deviations;

finding a second maximum negative deviation in the second set of deviations;

adding the first maximum positive deviation to the second maximum positive deviation; and adding the first maximum negative deviation to the second maximum negative deviation.

6. The method of claim 1, wherein said signal sources are current sources.

7. The method of claim 1, wherein said signal sources are voltage sources.

8. A test apparatus for testing the nonlinearity of a digital-to-analog converter that employs equally-weighted signal sources for converting high-order bits of digital input values, and unequally-weighted signal sources for converting low-order bits of digital input values, comprising:

a data generator for supplying digital input values to said digital-to-analog converter;

a measuring device for measuring analog output from said digital-to-analog converter, thereby obtaining measured values;

a control means coupled to said data generator, for causing said data generator to generate a minimum digital input value and a maximum digital input value, to generate a first set of digital input values by varying the high-order bits while holding the low-order bits constant, and to generate a second set of digital input values by varying the low-order bits while holding the high-order bits constant;

an ideal output calculation means coupled to said measuring device, for receiving the measured values obtained when the minimum digital input value and the maximum digital input value are generated, and calculating therefrom, for all other digital input values generated by said data generator, corresponding ideal output values constituting a linear input-output characteristic; and a nonlinearity calculation means coupled to said measuring device, for calculating deviations, from the corresponding ideal output values, of the measured values obtained when the first set of digital input values are generated, thereby obtaining a first set of deviations, for calculating deviations, from the corresponding ideal output values, of the measured values obtained when the second set of digital input values are generated, thereby obtaining a second set of deviations, and for finding, among all total deviations obtainable by adding a deviation in the first set of deviations to a deviation in the second set of deviations, a total deviation of maximum absolute value.

9. The test apparatus of claim 8, wherein said nonlinearity calculation means comprises:

a first error calculation means for receiving the measured values obtained when the first set of digital input values are generated, calculating the first set of deviations, and finding a first maximum positive deviation and a first maximum negative deviation among the first set of deviations;

a second error calculation means for receiving the measured values obtained when the second set of digital input values are generated, calculating the second set of deviations, and finding a second maximum positive deviation and a second maximum negative deviation among the second set of deviations; and a total error calculation means for adding the first maximum positive deviation to the second maximum positive deviation, and adding the first maximum negative deviation to the second maximum negative deviation.

10. The test apparatus of claim 8, wherein said control means holds the low-order bits to zero in the first set of digital input values.

11. The test apparatus of claim 8, wherein said control means holds the high-order bits to zero in the second set of digital input values.

12. The test apparatus of claim 8, wherein said signal sources are current sources.

13. The test apparatus of claim 8, wherein said signal sources are voltage sources.

* * * * *

UNITED STATES PATENT AND TRADEMARK OFFICE
CERTIFICATE OF CORRECTION

PATENT NO.   : 5,631,649
DATED        : May 20, 1997
INVENTOR(S)  : Nakamura

It is certified that error appears in the above-indentified patent and that said Letters Patent is hereby corrected as shown below: On the title page:
Item 30, change "Dec." to --Jan.--.

Signed and Sealed this

Ninth Day of September, 1997

Attest:

BRUCE LEHMAN

*Attesting Officer*        *Commissioner of Patents and Trademarks*